United States Patent
Chen

[11] Patent Number: 5,641,541
[45] Date of Patent: Jun. 24, 1997

[54] PROCESS TO APPLY PHOTORESIST PRINTER TO A WAFER

[75] Inventor: Yung-Ta Chen, Hsin-chu Hsien, Taiwan

[73] Assignee: Taiwan Semiconductor Manufacturing Company, Hsin-Chu, Taiwan

[21] Appl. No.: 537,101

[22] Filed: Sep. 29, 1995

[51] Int. Cl.$^6$ .................................................. C23C 16/00
[52] U.S. Cl. .................. 427/255.6; 216/43; 427/294; 427/299; 430/311; 438/974
[58] Field of Search .................. 156/632.1, 633.1, 156/646.1, 659.11; 437/229; 216/43; 430/311, 313, 506; 118/728, 715; 427/294, 299, 301, 248.1, 255.6

[56] References Cited

U.S. PATENT DOCUMENTS 3,586,554  6/1971  Couture et al. .................. 437/229 X
4,332,881  6/1982  Shankoff .................. 216/13 X

*Primary Examiner*—William Powell
*Attorney, Agent, or Firm*—George O. Saile; William J. Stoffel

[57] ABSTRACT

An improved method for applying a primer to a wafer surface prior to coating the wafer with photoresist is provided. The method comprises priming a wafer with HMDS, removing the wafer from the priming chamber, and closing the chamber. Next, the chamber, piping and primer source are evacuated. The bubbler canister, piping and wafer chamber are held at a pressure of about 15 inches $H_2O$ while the priming tool is idle between wafer priming operations. By maintaining the vaporizer, piping and wafer chamber at a partial vacuum, the primer will be prevented from condensing and forming harmful droplets on the wafer surface. The invention prevents primer condensation from forming on the wafer, thus improving photolithographic yields and device yields.

14 Claims, 2 Drawing Sheets

FIG. 1 - Prior Art

PROCESS TO APPLY PHOTORESIST PRINTER TO A WAFER

BACKGROUND OF INVENTION

1) Field of the Invention

This invention relates to structure and a method for manufacturing semiconductor devices and particularly to a photolithographic method of producing semiconductor devices and more particularly to a structure and a method for applying a primer to a wafer before a photoresist layer is applied.

2) Description of the Prior Art

In standard semiconductor manufacturing, a substrate surface is "primed" before the substrate is coated with photoresist. The primer or priming is a pre-resist coating of some material that will increase the adhesion of the resist to the substrate surface. The primer reduces the mount of lateral etching or undercutting. The adhesion of photoresist to wafer and mask surfaces is a function of the amount of inter-molecular bonding between the resist and the surface onto which it is applied. In addition to this fundamental adhesive force, which is chemical in nature (molecular and atomic bombing), there are "external" forces and factors that influence the ability of resist to withstand lateral etching. These factors include: the moisture content of the wafer and mask surfaces, the wetting characteristics of the resist on surfaces, the type of primer used and its method of application, the resist chemistry, the contamination or surface defects that occur at the interface of the resist and wafer surfaces.

Adhesion of photoresist to the substrate surface is reduced when the photoresist is applied over a hydrated substrate surface. The presence of water on the oxide surface allows the wet etchants to penetrate easily between the resist and the wafer or mask surface. The penetrating etchants etch the oxides under the resist making the oxide pattern smaller thus causing an "undercutting" problem. The smaller, less accurate oxide patterns can cause device failures and change the parameters of the subsequent devices. To remove moisture from the substrate/photoresist interface, a primer is applied to the substrate surface before a photoresist layer is formed thereover. The primer reacts with the moisture to "tie up" the moisture so that photoresist adhesion is increased. For example, primers such as hexamethyldisilizane (HMDS) are used to react with substrate-oxide surfaces so as to tie up molecular water. However, an accumulation (or liquid droplets) of primer on the substrate surface before the resist is applied will also affect the photoresist coverage and cause defects in the resist pattern which is subsequently formed.

Many solutions have been used to promote the adhesion of resists to wafer and other semiconductor surfaces. Adhesion promoters such as hexamethyldisilizane (HMDS), Trichlorophenylsilane (TCPS), bistrimethylsilylacetimide (BSA), and Xylene are used mainly on silicon dioxide surfaces, but can be used on other oxide, metal, and glass surfaces. HMDS is by far the most commonly used adhesion promoter and is preferred for a number of reasons. The adhesion promoters containing chloride are undesirable because of corrosion problems. Also, the toxicity and overall bonding effectiveness are less compared with HMDS. Some postbaking is nearly always required after treatment with all but HMDS, and the length of time over which an adhesive promoter remains effective on a wafer is much longer with HMDS compared to the others.

The application of adhesion promoters to wafer surfaces can be performed by one of three coating techniques: (1) wafer spin coating, (2) dip coating, or (3) vapor coating. Vapor priming is the use of primer vapors to provide conversion of the silicon dioxide or other surface. Vapor priming has an advantage of reducing contamination by solid particles since only vapors touch the wafer. A typical vapor priming system consists of a primer source, a wafer priming chamber and piping connecting the bubbler to the chamber. In operation, HMDS vapor and nitrogen flow form the source through the piping to the wafer priming chamber where the vapor flows past the wafers thus coating the wafers with an even layer of HMDS primer.

A problem with vapor priming of wafers is that often the primer condenses on the wafer thus forming liquid drops 27 of primer on the wafer surface. See FIG. 1. In some situations this primer condensation 27 is caused by primer condensation in the piping leading to the wafer chamber or from condensation on the wafer priming chamber walls.

This primer condensation on wafers will cause severe defects in wafers. In particular, the condensation will cause photoresist residue on the wafer surface after the photo resist is developed and etched. The defective photoresist pattern causes inadequate structures to be formed on the wafer. This vapor primer condensation occurs in the piping as well as in the priming chamber. This primer condensation problem becomes worse as the primer chamber is idle for longer periods of time, such as down times for fixing the machine, preventive maintenance, or line shut downs.

SUMMARY OF THE INVENTION

It is an object of the present invention to provide a structure method to apply vapor primer to a substrate without allowing the primer to form condensation droplets on the substrate.

It is another object of the present invention to provide a structure and a method of preventing primer condensation from forming in the piping between the primer bubbling canister and the wafer chamber and on the wafer chamber walls.

The method of the present invention for applying HMDS to a wafer, prior to coating the wafer with photoresist, which overcomes the above discussed and numerous other disadvantages and deficiencies of the prior art, comprises: providing a wafer chamber with an inlet and an outlet; a HMDS source for producing HMDS vapor; a conduit connecting said HMDS source and said wafer chamber; a chamber inlet valve located on said conduit between said HMDS source and said chamber; said chamber inlet valve having an open and closed position; an outlet duct connecting said outlet with an evacuation means; said evacuating means for evacuating said outlet duct, said wafer chamber, said conduit, and said source; and an outlet valve on said outlet duct between said chamber and said evacuation means; said outlet valve having an open and close position.

The method begins by (a) opening the chamber and placing a wafer into the chamber and closing the chamber. Next, (b) the chamber inlet valve is closed, the outlet valve is opened, and the wafer chamber is evacuated using the evacuating means. The evacuating means is turned off and the chamber is brought back to atmospheric pressure.

HMDS vapor from the HMDS source is (c) introduced into the conduit, and the chamber inlet valve is opened thereby allowing HMDS to flow into the wafer chamber thus priming the wafer with HMDS. The chamber inlet valve (d) is closed and the introduction of HMDS vapor from the source is stopped. The wafer chamber is evacuated using the evacuating means and the outlet valve is closed. The chamber (e) is opened and the primed wafer is removed. The chamber is then closed.

In the critical steps, (f) the chamber inlet valve and the outlet valve are opened. The source, the conduit duct, and the chamber are then evacuated. Next, in step (g) the chamber inlet valve and the outlet valve are closed. The chamber and the conduit are maintained at a pressure between about −12 to −17 inches of $H_2O$ thereby preventing moisture condensation from building up in the source, the conduit duct, and the chamber between the wafer priming steps (e) and (a). The system is maintained at the vacuum pressure between −12 to −17 inches of $H_2O$ until another wafer is ready to be processed as described in steps (a) to (e).

Thus, the present invention described herein achieves the objectives of: (1) applying vapor primer to a substrate without having the primer form condensation droplets on the substrate and (2) preventing primer condensation from forming in the piping between the primer bubbling canister and the wafer chamber and on the wafer chamber walls. The method of the invention evacuates the piping and the wafer chamber thus removing the primer vapor. Since the primer vapor is removed, primer condensation will not form in the piping, on the walls of the wafer chamber and on the wafer.

DETAILED DESCRIPTION OF THE PREFERRED EMBODIMENTS

Figure 1:
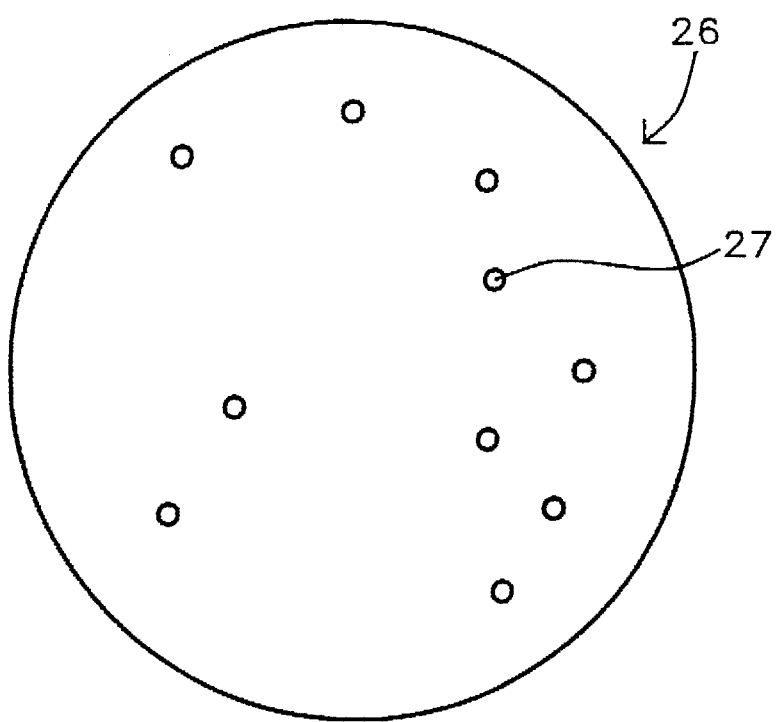
FIG. 1 shown a top down view of a wafer which has the primer condensation problem of the prior art.
Figure 2:
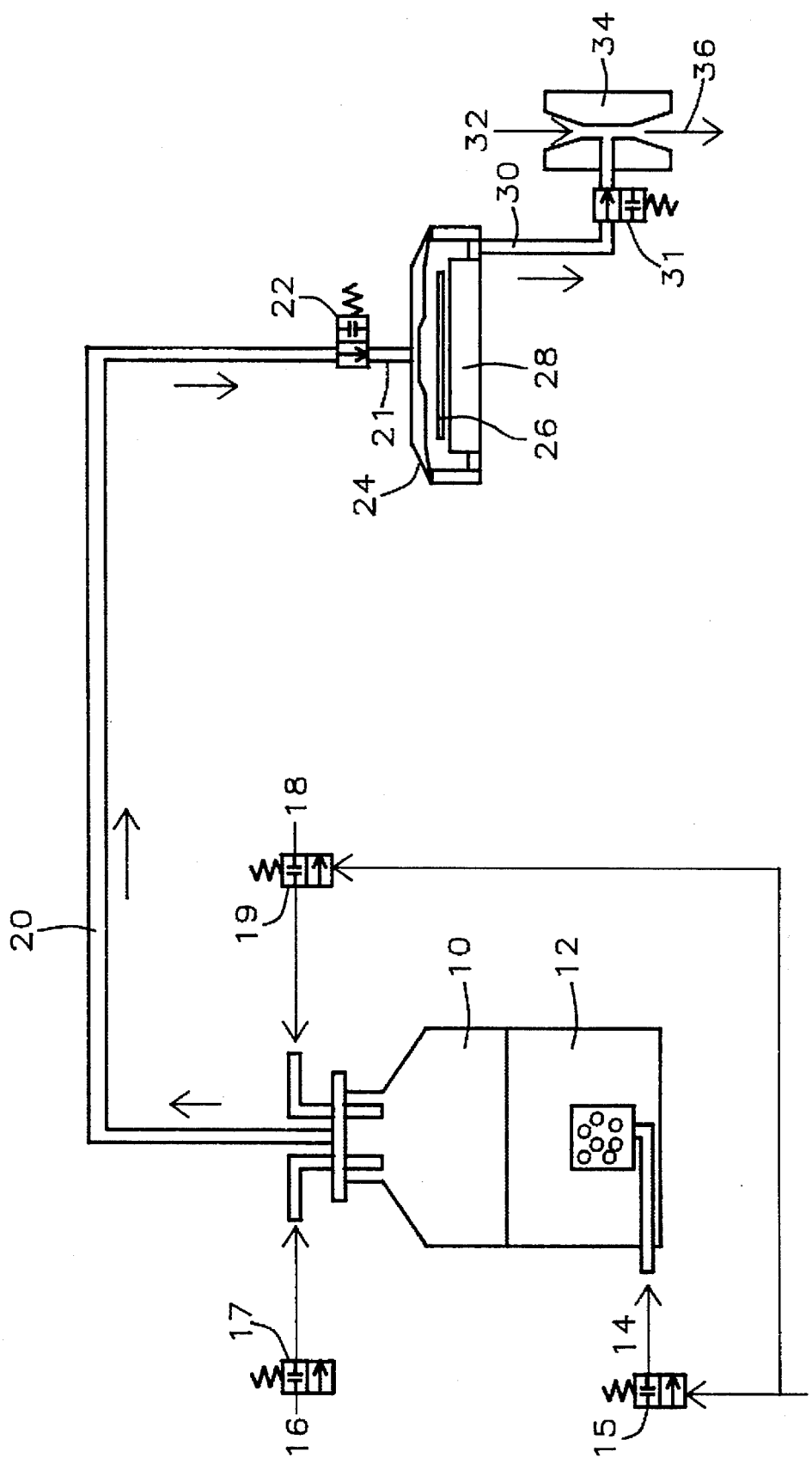
FIG. 2 is simplified schematic view of the primer system of the present invention for applying a primer on a wafer before forming a photoresist layer on the wafer.

The present invention will be described in detail with reference to the accompanying drawings. As shown in FIG. 2, a priming system comprises a wafer chamber 24 with an inlet 21 and an outlet; a HMDS bubbler 10 (e.g., primer source) for producing HMDS vapor; a conduit 20 connecting the HMDS bubbler 10 and the wafer chamber 24; a chamber inlet valve 22 located on the conduit 20 between the HMDS bubbler and the chamber 24; the chamber inlet valve 22 having an open and closed position, an outlet duct 30 connecting the outlet with an evacuation means; the evacuating means for evacuating the outlet duct 30, the wafer chamber 24, the conduit 20, and the source; and an outlet valve 31 on the outlet duct 30 between the chamber 24 and the evacuation means 34; the outlet valve 31 having an open and close position. Primer filler valve 17 controls the primer refill line 16 which replenishes the primer supply in the bubbler 10. Dilution gas control valve 19 controls the flow of carrier dilution gas flowing into the top of the bubbler 10. Outlet valve 31 controls the gas flow form the chamber 24 to the venturi 34. Exhaust stream 36 is the output from the venturi comprising clean dry air stream 32 and the outlet flow from the chamber 24.

The method of the invention begins by introducing a wafer to be primed with HMDS into the wafer chamber and the chamber is closed. Next, the chamber inlet valve 22 and the outlet valve 31 are opened and the chamber 24 is evacuated using an evacuating means. As shown in FIG. 2, the evacuating means is preferably a venturi 34 connected to the chamber outlet 30 and to a source of clean dry air 32 36. The chamber inlet valve 22 is closed and the clean dry air 32 is turned on to activate the vacuum on the chamber 24. The evacuating means can be a venturi 34 or a vacuum pump. Then the evacuation means is turned off. For the venturi 34, to turn off the evacuation, the clean dry air stream 32 is stopped by closing a valve (not shown).

Next, a dehydration bake is performed on the chamber. The dehydration bake is performed for a time between about 3 to 7 seconds and more is preferably about 5 seconds, at a temperature between about 115° to 125° C. and more is preferably about 120° C. and at a pressure between about −12 to −17 inches of $H_2O$ and more is preferably about −15 inches $H_2O$.

Following this, an carrier gas 14 is introduced into the bubbler 10 and the chamber inlet valve 22 is opened thereby allowing HMDS to flow into the wafer chamber. The gas 14 can be any suitable carrier gas such as, nitrogen or argon. This primes the wafer 26 with HMDS vapor. In operation, an inert gas 14 is bleed into the HMDS bubbler where it is directed into the HMDS bubbling canister 10 and the pressure in the canister 10 causes vaporization of the HMDS solution 12. The HMDS vapors are directed through the conduit 20 into the wafer treatment chamber 24, where an approximately 35 second dwell time provides an excellent level of adhesion of resist to the wafer 26 surface, such as silicon dioxide, aluminum oxide, silicon nitride, and others. The HMDS vapor is drawn from the canister 10 through the piping 20 and wafer chamber 24 by an exhaust venturi 34 which is activated by an air flow 32. The vapor flows past the wafers 26 thus coating the wafer 26 with an even layer of HMDS primer. The priming of the wafer, the chamber is held at a pressure in the range of about between 740 torrs and 780 torrs and preferably at a pressure of about 760 torrs and a HMDS/inert gas flow rate in the range between about 3.5 to 4.5 liters per minute and more preferably about 4 liters per min. The wafer chamber held at a temperature between about 117° to 123° C. and more preferably about 120° C. during the wafer priming. Many different liquid/vapor primers can be substituted for HMDS. Also, the carrier gas can be any inert gas, such as nitrogen or argon.

When the priming is complete, the carrier gasses 14 18 and the HMDS vapor are turned off using valves 15 and 18. Next, the chamber inlet valve 22 is closed and the wafer chamber 24 is evacuated through the outlet 30 and the venturi 34 by opening the outlet valve 31 and activating the venturi. The clean dry air 32 flows through the venturi 34 and out the venturi outlet 36 creating a vacuum on the system. The outlet valve 31 is then closed. The chamber 24 is then opened and the wafer 26 removed. The chamber is then shut.

After a vapor priming, the wafers should be placed in an absolutely clean, laminar-flow clean-air cool plate module and allowed to sit for about 60 seconds at about 19° C. The maximum delay between resist coating is sixty minutes and if delays exceeding this time occur, the wafers should be placed back into the wafer chamber.

In the critical steps, the chamber valve 22 and the outlet valve 31 are then opened and the bubbler 10, conduit 20, and wafer chamber 26 are evacuated. This removes the HMDS vapor from the bubbler 10, the conduit 20 and chamber 24. To accomplish this, the carrier gas flow 14 to the bubbles is turned off using valve 15. The chamber inlet 22 and outlet valves 31 are opened and the piping and chamber is evacuated by flowing the clean air dry 32 through the venturi 34 thus pulling a vacuum on the system.

The chamber inlet valve 22 and chamber outlet valve 31 are then closed. The clean dry air 32 to the venturi is turned off. The wafer chamber 24 and the conduit 20 are maintained at a pressure in the range of about −12 to −17 inch-H₂O and more preferably of about −15 inches of H₂O. The system is maintained at the vacuum pressure between −12 to −17 inches of H₂O until another wafer is ready to be processed as described above.

The process of the present invention significantly reduces the primer condensation problem on wafers. By holding the bubbler 10, conduit 20, and chamber 24, at a partial pressure, condensate is less likely to form and is more likely to remain in the vapor phase. The process prevents primer condensation from forming in the piping between primer bubbler canister, the wafer chamber walls and on the wafer. Thus photoresist problems are eliminated, device yields are increased and wafer rework is reduced. Also the process is relatively simple to implement and low cost compared to the benefits.

The process of the current invention can be implemented for other photoresist primers, such as Trichlorophenylsilane (TCPS), bistrimethylsilylacetimide (BSA), Xylene and others where primer or moisture condensation on wafers is a problem.

While the invention has been particularly shown and described with reference to the preferred embodiments thereof, it will be understood by those skilled in the art that various changes in form and details may be made without departing from the spirit and scope of the invention.

What is claimed is:

1. An improved method of applying hexamethyldisilizane (HMDS) to a wafer prior to coating said wafer with photoresist; providing a wafer chamber with an inlet and an outlet; a HMDS source for producing HMDS vapor; a conduit connecting said HMDS source and said wafer chamber; a chamber inlet valve located on said conduit between said HMDS source and said chamber; said chamber inlet valve having an open and closed position; an outlet duct connecting said outlet with an evacuation means; said evacuating means for evacuating said outlet duct, said wafer chamber, said conduit, and said source; and an outlet valve on said outlet duct between said chamber and said evacuation means; said outlet valve having an open and close position; and including: (a) opening said chamber and placing a wafer into said chamber and closing said chamber; (b) closing said chamber inlet valve, opening said outlet valve, and evacuating said wafer chamber using said evacuating means, and turning off said evacuating means; (c) introducing HMDS vapor from said HMDS source into said conduit, and opening said chamber inlet valve thereby allowing HMDS to flow into said wafer chamber thus priming said wafer with HMDS; (d) closing said chamber inlet valve, stopping said introduction of HMDS vapor from said source; evacuating said wafer chamber using said evacuating means; and closing said outlet valve; (e) opening said chamber and removing said primed wafer and closing said chamber; the method comprising:

(1) opening said chamber inlet valve, opening said outlet valve, and evacuating said source, said conduit duct, and said chamber using said evacuating means; and (2) closing said chamber inlet valve, closing said outlet valve, and maintaining the chamber and said conduit at a pressure between about −12 to −17 inches of H₂O thereby preventing primer condensation from building up in said source, said conduit duct, and said chamber between the wafer steps (e) and (a); and repeating steps (a) through (e) and (1) through (2).

2. The method of claim 1 wherein after said step (b), baking said wafer at a temperature of between about 115° to 125° C. and at a pressure between about −12 to −17 inches-H₂O and for a time between about 3 to 7 seconds thereby dehydrating said wafer.

3. The method of claim 1 wherein said evacuating means is achieved by a venturi.

4. The method of claim 1 wherein said evacuating means is achieved by a vacuum pump.

5. The method of claim 1 wherein during the priming of said wafer, said chamber is held at a pressure in the range of about between 740 torrs and 780 torrs.

6. The method of claim 1 wherein said wafer chamber held at a temperature between about 117° to 123° C. during the wafer priming.

7. The method of claim 1 wherein said HMDS primer is a primer selected from the group consisting of: Trichlorophenylsilane (TCPS), bistrimethylsilylacetimide (BSA), and Xylene.

8. An improved method of applying hexamethyldisilizane (HMDS) to a wafer prior to coating said wafer with photoresist; providing a wafer chamber with an inlet and an outlet; a HMDS bubbler for producing HMDS vapor; a conduit connecting said HMDS bubbler and said wafer chamber; a chamber inlet valve located on said conduit between said HMDS bubbler and said chamber; said chamber inlet valve having an open and closed position, an outlet duct connecting said outlet with an evacuation means; said evacuating means for evacuating said outlet duct, said wafer chamber, said conduit, and said source; and an outlet valve on said outlet duct between said chamber and said evacuation means; said outlet valve having an open and close position; the method comprising:

(a) opening said chamber, placing a wafer into said chamber, and closing said chamber;

(b) closing said chamber inlet valve, opening said outlet valve, evacuating said wafer chamber using said evacuating means, and turning off said evacuation means;

(c) introducing an inert gas into said bubbler and opening said chamber inlet valve thereby allowing HMDS vapor to flow into said wafer chamber thus priming said wafer with HMDS;

(d) closing said chamber inlet valve, stopping said introduction of inert gasses in to said bubbler, evacuating said wafer chamber using said evacuating means and closing said outlet valve;

(e) opening said chamber, removing the primed wafer and closing said outlet valve;

(f) opening said chamber inlet valve and evacuating said bubbler, said conduit duct, and said chamber using said evacuating means;

(g) closing said chamber inlet valve and maintaining the chamber and conduit at a pressure between about −12 to −17 inches of H₂O; and (f) repeating the above steps (a) through (g).

9. The method of claim 8 wherein after said step (b), baking said wafer at a temperature of between about 115° to 125° C. and at a pressure between about −12 to −17 inches-H₂O and for a time between about 3 to 7 seconds thereby dehydrating said wafer.

10. The method of claim 8 wherein said evacuating means is achieved by a venturi.

11. The method of claim 8 wherein said evacuating means is achieved by a vacuum pump.

12. The method of claim 8 wherein during step (c), said chamber is held at a pressure in the range of about between 740 torrs and 780 torrs.

13. The method of claim 8 wherein said wafer chamber held at a temperature between about 117° to 123° C. during step (c).

14. The method of claim 8 wherein said HMDS primer is a primer selected from the group consisting of: Trichlorophenylsilane (TCPS), bistrimethylsilylacetimide (BSA), and Xylene.

* * * * *